United States Patent
Kan

(10) Patent No.: US 8,243,525 B1
(45) Date of Patent: Aug. 14, 2012

(54) REFRESHING NON-VOLATILE SEMICONDUCTOR MEMORY BY READING WITHOUT REWRITING

(75) Inventor: Alan Chingtao Kan, Diamond Bar, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 350 days.

(21) Appl. No.: 12/571,330

(22) Filed: Sep. 30, 2009

(51) Int. Cl.
*G11C 11/34* (2006.01)

(52) U.S. Cl. ......... 365/185.25; 365/185.11; 365/185.17; 365/185.23; 365/185.33

(58) Field of Classification Search ............. 365/185.25, 365/185.11, 185.17, 185.23, 185.33
See application file for complete search history.

(56) References Cited

U.S. PATENT DOCUMENTS

| | | | |
|---|---|---|---|
| 6,166,959 A | 12/2000 | Gupta et al. | |
| 7,079,422 B1 | 7/2006 | Wong | |
| 7,292,490 B1 | 11/2007 | Shu et al. | |
| 7,447,096 B2 | 11/2008 | Riekels et al. | |
| 7,495,962 B2 | 2/2009 | Mokhlesi | |
| 8,060,797 B2 * | 11/2011 | Hida et al. | 714/704 |
| 8,078,923 B2 * | 12/2011 | Nagadomi et al. | 714/706 |
| 2007/0091677 A1 | 4/2007 | Lasser et al. | |
| 2009/0201736 A1 * | 8/2009 | Nguyen et al. | 365/185.12 |
| 2010/0202203 A1 * | 8/2010 | Choi et al. | 365/185.09 |
| 2010/0313084 A1 * | 12/2010 | Hida et al. | 714/704 |
| 2011/0302476 A1 * | 12/2011 | Lee et al. | 714/763 |

FOREIGN PATENT DOCUMENTS

WO    WO2009107268    *    9/2009

* cited by examiner

*Primary Examiner* — Fernando Hidalgo

(57) ABSTRACT

A non-volatile semiconductor memory is disclosed comprising a first memory device including a plurality of memory segments, and control circuitry operable to determine whether a memory segment in the first memory device needs refreshing, and when the memory segment needs refreshing, read data from the memory segment into a data register without rewriting the data.

18 Claims, 6 Drawing Sheets

US 8,243,525 B1

REFRESHING NON-VOLATILE SEMICONDUCTOR MEMORY BY READING WITHOUT REWRITING

BACKGROUND

A non-volatile semiconductor memory may be employed as mass storage for a computer system (e.g., desktop, laptop, portable, etc.) or a consumer device (e.g., music player, cell phone, camera, etc.) or other suitable application. The non-volatile semiconductor memory may comprise one or more memory devices (such as a flash memory) and control circuitry for accessing each memory device. Each memory device is coupled to an I/O bus, as well as a number of interface control lines. When issuing a program command or an erase command to a memory device, the control circuitry transfers the address and command data (and write data for a program operation) over the I/O bus. When issuing a read command, the control circuitry transfers the address and command data over the I/O bus and then receives the read data over the I/O bus.

Although flash memory is non-volatile (retains data when power is removed), the charge on the floating gate of each storage cell will eventually degrade over time until the retention capability is lost. In addition, the retention degradation may be precipitated by environmental conditions (e.g., temperature), as well as interference when accessing adjacent or near adjacent cells. For example, a phenomena referred to as "read disturb" occurs when a read operation interferes with the charge of adjacent cells. To prevent catastrophic data loss, the storage cells are periodically refreshed (by reading and rewriting the data) after a predetermined interval and/or after a number of access operations to adjacent cells. However, rewriting the storage cells during a refresh operation takes time which degrades overall performance of the memory device, and it consumes power which may be a concern in portable applications. In addition, a non-volatile semiconductor memory typically has a limited number of erase/program cycles. If the storage cells must first be erased before being rewritten during a refresh operation, each refresh operation decreases the remaining number of erase/program cycles.

DETAILED DESCRIPTION OF EMBODIMENTS OF THE INVENTION

Figure 1:
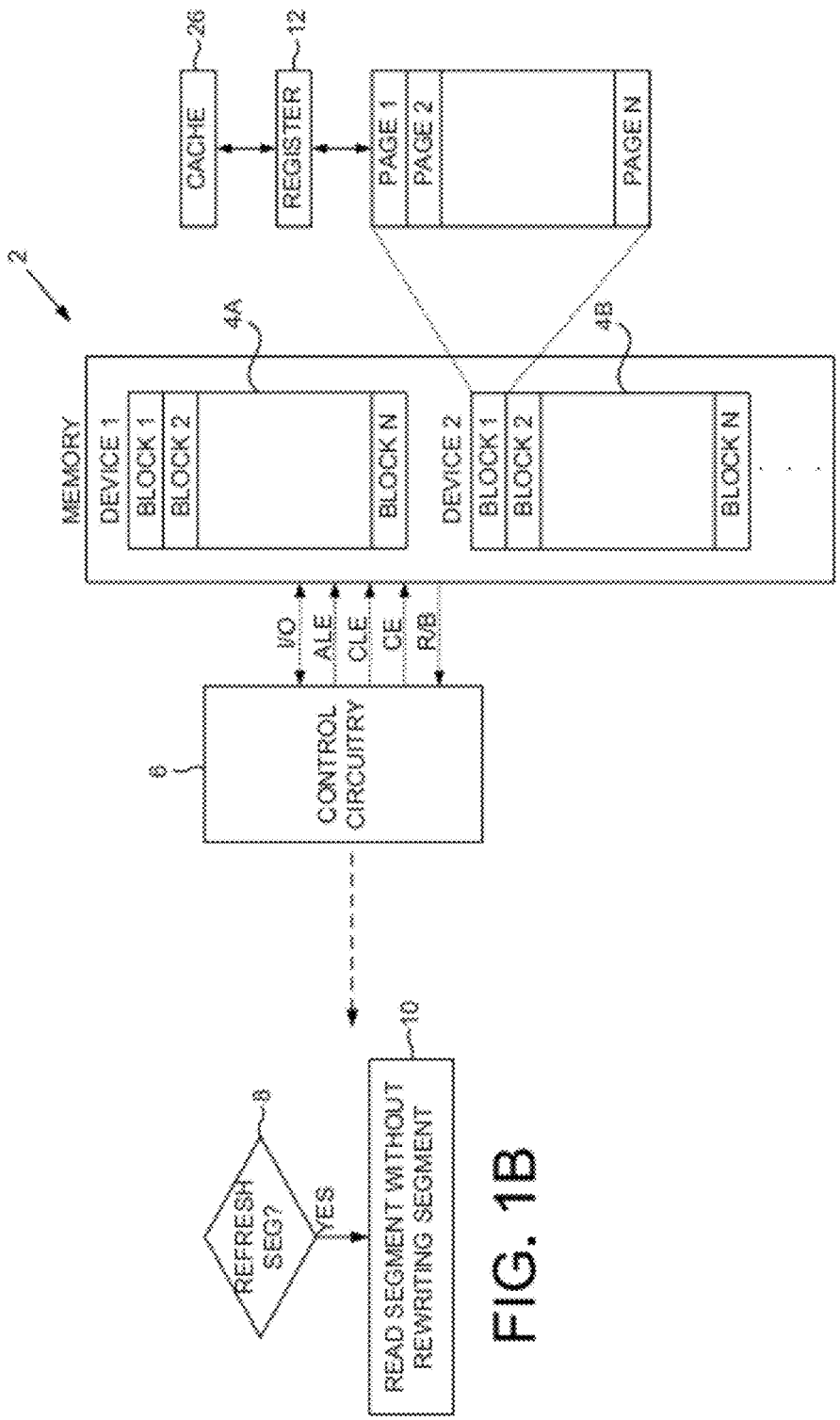
FIG. 1A shows a non-volatile semiconductor memory according to an embodiment of the present invention comprising a plurality of memory devices (e.g., flash memories) and control circuitry (e.g., a flash controller).
FIG. 1B is a flow diagram executed by the control circuitry according to an embodiment of the present invention wherein when a memory segment of a memory device needs refreshing, data is read from the memory segment without rewriting the data.

FIG. 1A shows a non-volatile semiconductor memory 2 according to an embodiment of the present invention comprising a first memory device 4A including a plurality of memory segments, and control circuitry 6 operable to execute the flow diagram of FIG. 1B. The control circuitry 6 determines whether a memory segment in the first memory device needs refreshing (step 8), and when the memory segment needs refreshing, reads data from the memory segment into a data register 12 without rewriting the data (step 10).

Figure 6:
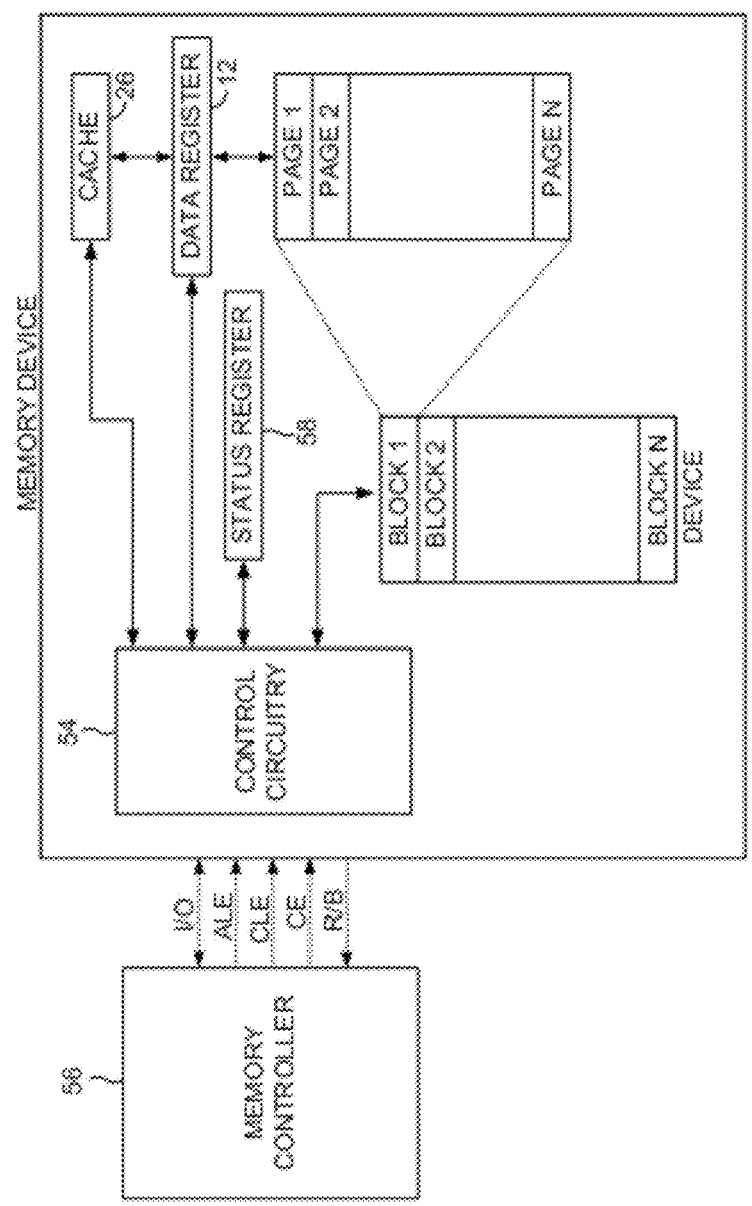
FIG. 6 shows a non-volatile semiconductor memory according to an embodiment of the present invention wherein a flash memory comprises the control circuitry and the memory device (e.g., a NAND array).

The non-volatile semiconductor memory 2 may comprise any suitable configuration of control circuitry 6 and memory devices 4A-4B. In one embodiment, each memory device 4A-4B comprises a suitable flash memory (e.g., NAND or NOR flash), and the control circuitry 6 comprises a suitable flash controller. In one embodiment, the control circuitry 6 implements a solid state drive (SSD) by emulating a disk drive accessible by a host system using a standard disk drive communication protocol (e.g., the ATA protocol). In another embodiment described below with reference to FIG. 6, the control circuitry 6 may be implemented within the flash memory, that is, the flash memory may implement the refresh algorithm internally rather than implemented by the flash controller.

The memory segments in the memory devices 4A-4B may comprise any suitable configuration. In one embodiment, each memory device comprises a plurality of blocks, wherein each block comprises a plurality of pages. The blocks are accessed a page at a time through the data register 12. That is, write data is stored in the data register 12 and then the control circuitry 6 issues a write command to flush the data in the register 12 to the target page. During a read operation, the data is read from the page into the data register 12, and then transferred to the control circuitry 6. In one embodiment, the memory segment that is refreshed may comprise a partial page, a single page, multiple pages, an entire block, or multiple blocks.

The control circuitry 6 may implement any suitable refresh algorithm for determining when a memory segment in one of the memory devices needs refreshing. For example, the control circuitry 6 may determine that a memory segment needs refreshing after a predetermined interval, or after a predetermined number of write and/or read operations to proximate memory segments, or a combination of these or other factors. In another embodiment, the control circuitry 6 may execute the refresh algorithm when the non-volatile semiconductor memory 2 is idle (not processing access commands from a host) regardless as to whether the data may be degrading.

When a memory segment needs refreshing, the control circuitry 6 reads the data from the memory segment into the data register 12 without rewriting the data into the same or other memory device. In one embodiment, the control circuitry 6 does not read the data from the data register 12 since there is no use for the data. The data in the data register 12 is simply overwritten during the next access operation (refresh read or normal read/write operation).

The prior art teaches that a non-volatile semiconductor memory must be rewritten in order to refresh the memory segments, whereas the inventors have discovered that performing a read operation alone will effectuate a refresh operation. Refreshing the memory segments without rewriting the data improves performance, reduces power consumption, and increases endurance since an erase/program cycle is avoided.

Figure 2:
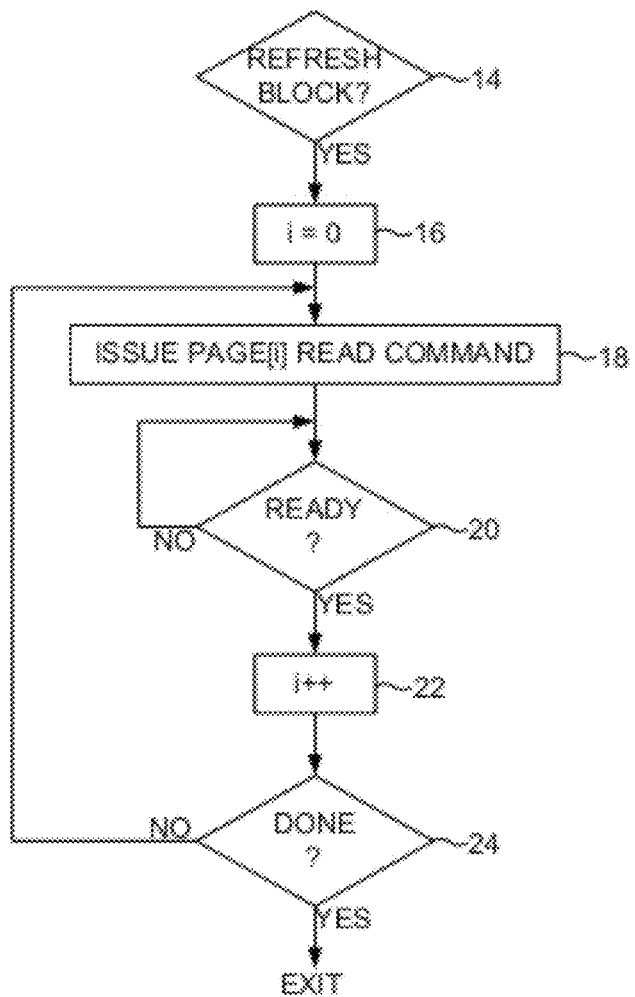
FIG. 2 is a flow diagram according to an embodiment of the present invention wherein each memory device comprises a plurality of blocks, each block comprises a plurality of pages, and the pages of a block are refreshed together to mitigate read disturb.

FIG. 2 is a flow diagram according to an embodiment of the present invention wherein each memory device comprises a plurality of blocks, and each block comprises a plurality of pages. When one of the pages of a block needs refreshing, all of the pages in the block are read which avoids degrading proximate pages due to read disturb. When one of the blocks needs refreshing (step 14), a page counter i is initialized to zero (step 16). A command is issued to read page[i], and when the memory device returns a ready status indicating that the read operation is completed (step 20), the page counter i is incremented (step 22) and the next page is read (step 18). This process is repeated until all of the pages in the block have been read (step 24).

FIG. 1A illustrates an embodiment of the present invention wherein each memory device (e.g., memory device 4B) comprises a cache register 26. When programming a page of memory during a write operation, the control circuitry 6 transfers the write data to the cache register 26. The memory device then transfers the write data from the cache register 26 to the data register 12. Once the transfer is complete, the memory device signals the control circuitry 6 that it is ready to receive another write command. In this manner, new write data can be received from the control circuitry 6 and stored in the cache register 26 while the write data stored in the data register 12 is being programmed into the target page. Similarly during a read operation, the read data is read from a page into the data register 12, and then transferred into the cache register 26. In this manner, a next page can be read into the data register 12 while the previous read data is transferred from the cache register 26 to the control circuitry 6.

Figure 3A:
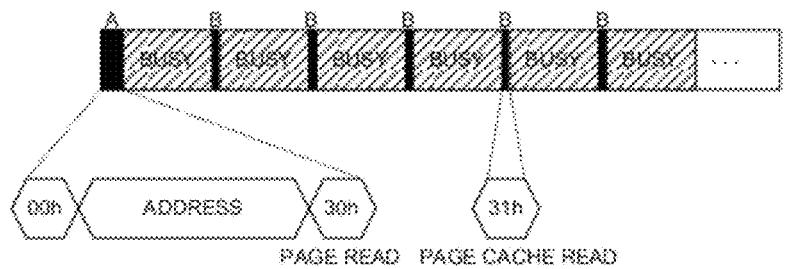
FIG. 3A shows an embodiment of the present invention wherein a PAGE CACHE READ command is issued to the memory device to expedite the refresh operation.

FIG. 3A illustrates an embodiment of the present invention wherein the cache mode of the memory device is exploited to increase the performance of a refresh operation. When refreshing a block, a PAGE READ command is issued to read the first page of memory. The PAGE READ command comprises the control command 00h followed by the address of the first page of the block, followed by the control command 30h (an "A" cycle in FIG. 3A). When the memory device finishes reading the page into the data register 12 and transferring the data into the cache register 26, the control circuitry detects that the memory device is no longer busy and issues a PAGE CACHE READ command by sending the control command 31h to the memory device (a "B" cycle in FIG. 3A). The PAGE CACHE READ command (31h) causes the memory device to automatically read the next page in the block into the data register 12 without needing to send the address of the next page. When the control circuitry reaches the last page of the block, an EXIT CACHE READ command (34h) is issued to the memory device.

Figure 3B:
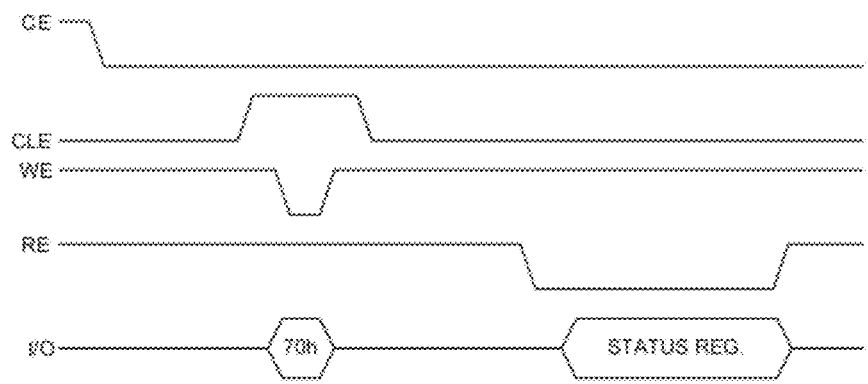
FIG. 3B shows an embodiment of the present invention wherein a status is read from a status register in the memory device to determine when a refresh read has been completed.
Figure 3C:
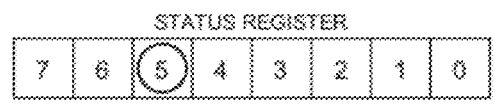
FIG. 3C shows a status register wherein bit 5 indicates whether a refresh read has finished reading data from the memory segment into the data register.

The memory device may indicate whether it is busy processing a read command in any suitable manner, such as by toggling a ready/busy control line connected to the control circuitry. In another embodiment illustrated in FIG. 3B, the memory device comprises a status register that is read by the control circuitry (command 70h) to determine whether the memory device has completed a read operation. For example, in the embodiment wherein the control circuitry issues a PAGE CACHE READ command (FIG. 3A), bit 5 of the status register (FIG. 3C) indicates when the memory device has completed reading data from a page into the data register 12.

Figure 4A:
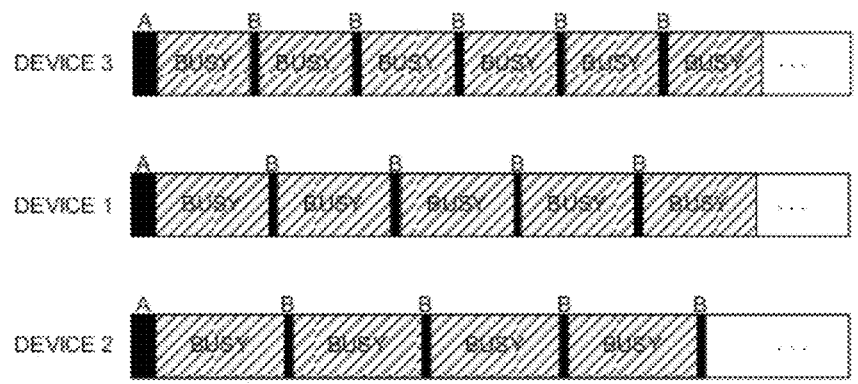
FIG. 4A shows an embodiment of the present invention wherein refresh read commands are issued to a plurality of memory devices in an order based on the read time of each memory device.

In one embodiment, the memory device executes a read operation over a read time which may vary between memory devices, particularly if different types of memory devices are employed in the same non-volatile semiconductor memory. For example, memory device 4A of FIG. 1A may comprise a multi-level cell (MLC) type of flash memory and memory device 4B may comprise a single-level cell (SLC) flash memory, wherein the read time of an SLC is shorter than that of an MLC. In an embodiment illustrated in FIG. 4A, during a refresh operation the control circuitry issues read commands to a plurality of the memory devices in an order based on the read times of the memory devices. In the example shown in FIG. 4A, the read commands are issued first to the memory devices having the shorter read times.

Figure 4B:
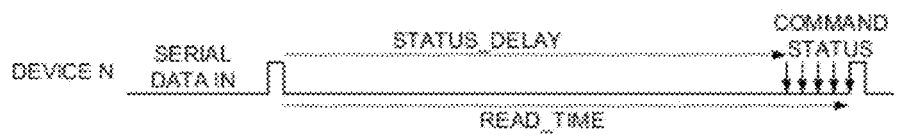
FIG. 4B illustrates how the read time is measured for each memory device relative to when the status register indicates a read operation has completed.

FIG. 4B shows an embodiment of the present invention for measuring the read time of a memory device. The control circuitry 6 issues a read command and then delays for a STATUS_DELAY time. The control circuitry 6 then begins polling the memory device to read the status register, and when the status register indicates the read operation has been completed, the control circuitry 6 saves the READ_TIME. In another embodiment, the control circuitry 6 may monitor a control signal (e.g., a READY/BUSY line) to determine when the memory device has completed the read operation.

Figure 5:
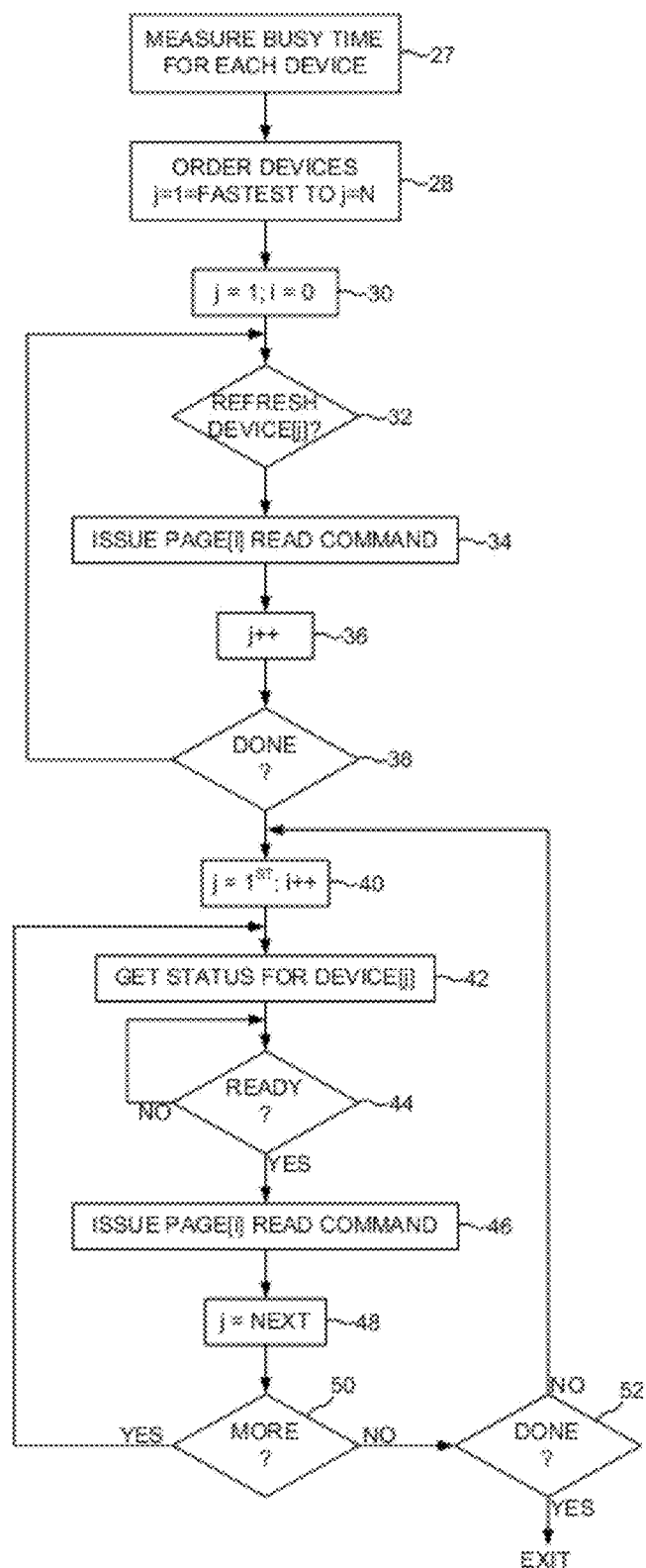
FIG. 5 is a flow diagram according to an embodiment of the present invention wherein the read times for each memory device is measured, and then the refresh read commands are issued to the memory devices in an order based on the read times.

FIG. 5 shows a flow diagram according to an embodiment of the present invention wherein the read times of a plurality of memory devices are measured (step 27) and then ordered from slowest to fastest (step 28). When two or more of the memory devices need to be refreshed, a page counter i and a device counter j are initialized (step 30). If memory device[j] needs to be refreshed (step 32), a read command is issued to read page[i] from the memory device[j] (step 34). The device counter j is incremented (step 36) and the flow diagram repeated from step 32 until a read command has been issued to all of the memory devices that need to be refreshed (step 38). The device counter j is reset to the first memory device being refreshed and the page counter i is incremented (step 40). The status for memory device[j] is determined (step 42) such as by reading the status register. When the status indicates that memory device[j] is ready (step 44), a read command is issued to read page[i] from the memory device[j] (step 46). The device counter j is then set to the next device that is being refreshed (step 48) and the flow diagram is repeated from step 42 until a read command has been issued to all of the memory devices that need to be refreshed (step 50). The flow diagram is then repeated from step 40 until a read command has been issued to read all of the pages from all of the memory devices that need to be refreshed (step 52).

The non-volatile semiconductor memory may comprise any suitable configuration. In the embodiment of FIG. 1A, the non-volatile semiconductor memory 2 comprises control circuitry 6 in the form of a flash controller that communicates with flash memory devices. In an alternative embodiment shown in FIG. 6, the control circuitry 54 is integrated with a memory device, such as a flash memory device connected to a flash controller 56. In one embodiment, the control circuitry 54 within each memory device implements the refresh algorithm in order to determine when to refresh memory segments of the memory device (e.g., pages in a block of memory). In an alternative embodiment, the flash controller 56 may determine when a memory segment within the memory device needs to be refreshed, and issues a refresh command to the memory device. The control circuitry 54 within the memory device responds to the refresh command by performing the refresh read operations of the memory segment(s). In one embodiment, a bit in a status register 58 may indicate the status of the refresh operation, including when the refresh operation has been completed.

What is claimed is:

1. A non-volatile semiconductor memory comprising a first memory device including a plurality of memory segments, and control circuitry operable to:
   determine whether a memory segment in the first memory device needs refreshing; and
   when the memory segment needs refreshing, read data from the memory segment into a data register without rewriting the data,
   wherein the first memory device comprises the data register, and when refreshing the memory segment the control circuitry does not read the data from the data register.

2. The non-volatile semiconductor memory as recited in claim 1, wherein after reading the data from the memory segment into the data register, the control circuitry is further operable to overwrite the data in the data register when executing a subsequent access operation.

3. The non-volatile semiconductor memory as recited in claim 1, wherein the control circuitry is operable to issue a read command to the first memory device to read the data from the memory segment into the data register.

4. The non-volatile semiconductor memory as recited in claim 3, wherein the read command comprises a PAGE READ command.

5. The non-volatile semiconductor memory as recited in claim 4, wherein the control circuitry is further operable to issue a first PAGE CACHE READ command to the first memory device after issuing the PAGE READ command.

6. The non-volatile semiconductor memory as recited in claim 5, wherein the first memory device further comprises a status register, and the control circuitry is further operable to:
   issue a READ STATUS command to the first memory device after issuing the first PAGE CACHE READ command;
   receive status from the status register; and
   when the status indicates data has been read from the memory segment into the data register, issue a second PAGE CACHE READ command to the first memory device.

7. The non-volatile semiconductor memory as recited in claim 3, further comprising a second memory device including a plurality of memory segments and a data register, wherein the control circuitry is further operable to:
   calibrate a first read time for the first memory device and a second read time for the second memory device, wherein the read times correspond to the time required for each memory device to read data into the respective data register; and
   when a first memory segment in the first memory device needs refreshing and a second memory segment in the second memory device needs refreshing, issue a first read command to the first memory device and a second read command to the second memory device in an order based on the read times.

8. The non-volatile semiconductor memory as recited in claim 7, wherein the control circuitry is operable to issue the second read command before the first read command when the second read time is less than the first read time.

9. The non-volatile semiconductor memory as recited in claim 1, wherein the control circuitry is further operable to determine that the memory segment needs refreshing by entering an idle mode.

10. A method of operating a non-volatile semiconductor memory comprising a first memory device including a plurality of memory segments, the method comprising:
    determining whether a memory segment in the first memory device needs refreshing; and
    when the memory segment needs refreshing, reading data from the memory segment into a data register without rewriting the data,
    wherein the first memory device comprises the data register, and when refreshing the memory segment the data is not read from the data register.

11. The method as recited in claim 10, wherein after reading the data from the memory segment into the data register, further comprising overwriting the data in the data register when executing a subsequent access operation.

12. The method as recited in claim 10, further comprising issuing a read command to the first memory device to read the data from the memory segment into the data register.

13. The method as recited in claim 12, wherein the read command comprises a PAGE READ command.

14. The method as recited in claim 13, further comprising issuing a first PAGE CACHE READ command to the first memory device after issuing the PAGE READ command.

15. The method as recited in claim 14, wherein the first memory device further comprises a status register, further comprising:
    issuing a READ STATUS command to the first memory device after issuing the first PAGE CACHE READ command;
    receiving status from the status register; and
    when the status indicates data has been read from the memory segment into the data register, issuing a second PAGE CACHE READ command to the first memory device.

16. The method as recited in claim 12, wherein the non-volatile semiconductor memory further comprises a second memory device including a plurality of memory segments and a data register, further comprising:
    calibrating a first read time for the first memory device and a second read time for the second memory device, wherein the read times correspond to the time required for each memory device to read data into the respective data register; and
    when a first memory segment in the first memory device needs refreshing and a second memory segment in the second memory device needs refreshing, issuing a first read command to the first memory device and a second read command to the second memory device in an order based on the read times.

17. The method as recited in claim 16, further comprising issuing the second read command before the first read command when the second read time is less than the first read time.

18. The method as recited in claim 10, further comprising determining that the memory segment needs refreshing by entering an idle mode.

* * * * *